(12) United States Patent
Pietambaram et al.

(10) Patent No.: US 7,683,445 B2
(45) Date of Patent: Mar. 23, 2010

(54) ENHANCED PERMEABILITY DEVICE STRUCTURES AND METHOD

(75) Inventors: Srinivas V. Pietambaram, Chandler, AZ (US); Nicholas D. Rizzo, Gilbert, AZ (US); Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 217 days.

(21) Appl. No.: 11/740,066

(22) Filed: Apr. 25, 2007

(65) Prior Publication Data
US 2007/0284683 A1    Dec. 13, 2007

Related U.S. Application Data

(63) Continuation-in-part of application No. 11/066,884, filed on Feb. 24, 2005, now Pat. No. 7,285,835.

(51) Int. Cl.
*H01L 29/82* (2006.01)

(52) U.S. Cl. .......... 257/421; 257/295; 257/E27.006; 438/3; 977/838; 977/933; 365/171

(58) Field of Classification Search ............ 257/421, 257/E27.006
See application file for complete search history.

(56) References Cited

U.S. PATENT DOCUMENTS

| | | | |
|---|---|---|---|
| 3,691,541 | A | 9/1972 | Bruder |
| 6,233,126 | B1 | 5/2001 | Van der Zaag et al. |
| 6,238,731 | B1 | 5/2001 | Ruigrok et al. |
| 6,778,433 | B1 * | 8/2004 | Tang .......................... 365/173 |

(Continued)

OTHER PUBLICATIONS

Yu et al., "Structure and Magnetic Properties of SiO2 Coated Fe2O3 Nanoparticles Synthesized by Chemical Vapor Condensation Process," Rev. Adv. Mater. Sci. 4 (2003) pp. 55-59.

(Continued)

*Primary Examiner*—Tu-Tu V Ho
(74) *Attorney, Agent, or Firm*—Ingrassia Fisher & Lorenz, P.C.

(57) ABSTRACT

Low power magnetoelectronic device structures and methods therefore are provided. The magnetoelectronic device structure (100, 150, 450, 451) comprises a programming line (104, 154, 156, 454, 456), a magnetoelectronic device (102, 152, 452) magnetically coupled to the programming line (104, 154, 156, 454, 456), and an enhanced permeability dielectric (EPD) material (106, 108, 110, 158, 160, 162, 458, 460, 462) disposed adjacent the magnetoelectronic device. The EPD material (106, 108, 110, 158, 160, 162, 458, 460, 462) comprises multiple composite layers (408) of magnetic nanoparticles (406) embedded in a dielectric matrix (409). The composition of the composite layers is chosen to provide a predetermined permeability profile. A method for making a magnetoelectronic device structure is also provided. The method comprises fabricating the magnetoelectronic device (102, 152, 452) and depositing the programming line (104, 154, 156, 454, 456). The EPD material (106, 108, 110, 158, 160, 162, 458, 460, 462) comprising the multiple composite layers (408) is formed around the magnetoelectronic device (102, 152, 452) and/or between the device (102, 152, 452) and the programming line (104, 154, 156, 454, 456). The presence of the EPD structure (470, 480, 490) in proximity to the programming line (104, 154, 156, 454, 456) and/or the magnetoelectronic device (102, 152, 452) reduces the required programming current.

17 Claims, 8 Drawing Sheets

U.S. PATENT DOCUMENTS

| | | | |
|---|---|---|---|
| 2001/0005034 A1* | 6/2001 | Forbes et al. | 257/531 |
| 2001/0035545 A1* | 11/2001 | Schuster-Woldan et al. | 257/296 |
| 2002/0191352 A1* | 12/2002 | Nakamoto et al. | 360/319 |
| 2003/0047728 A1 | 3/2003 | Chen | |
| 2003/0052757 A1* | 3/2003 | McKinzie et al. | 335/6 |
| 2004/0061166 A1* | 4/2004 | Kim | 257/314 |
| 2004/0233010 A1* | 11/2004 | Akram et al. | 333/1 |
| 2004/0253437 A1* | 12/2004 | Ingvarsson et al. | 428/329 |
| 2005/0029562 A1* | 2/2005 | Mizuguchi | 257/295 |
| 2005/0142385 A1* | 6/2005 | Jin | 428/694 T |
| 2006/0186495 A1 | 8/2006 | Rizzo et al. | |

OTHER PUBLICATIONS

Kumar et al., "Synthesis and Atomic-Level Characterization of Ni Nanoparticles in Al2O3 Matrix," Applied Physics Letters, vol. 81, No. 22, Nov. 25, 2002, pp. 4204-4206.

Kumar et al., "Self-Assembled Epitaxial and Polycrystalline Magnetic Nickel Nanocrystallites," Applied Physics Letters, vol. 79, No. 17, Oct. 22, 2001, pp. 2817-2819.

* cited by examiner

ENHANCED PERMEABILITY DEVICE STRUCTURES AND METHOD

CROSS-REFERENCES TO RELATED APPLICATIONS

This is a continuation-in-part of application Ser. No. 11/066,884, filed Feb. 24, 2005.

FIELD OF THE INVENTION

The present invention generally relates to magnetoelectronic devices, and more particularly relates to low power magnetoelectronic device structures that utilize enhanced permeability materials.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronic information devices include, but are not limited to, Magnetoresistive Random Access Memory (MRAM), magnetic sensors, and read/write heads and hard disks for disk drives.

A magnetoelectronic information device, such as an MRAM, typically includes an array of memory elements. Each memory element typically has a structure that includes multiple magnetic layers separated by various non-magnetic layers. Information is stored as directions of magnetization vectors in the magnetic layers. Magnetic vectors in one magnetic layer are magnetically fixed or pinned, while the magnetization direction of another magnetic layer is free to switch between the same and opposite directions that are called "parallel" and "anti-parallel" states, respectively. In response to parallel and anti-parallel states, the magnetic memory element represents two different resistances. The measured resistance of the magnetic memory element has minimum and maximum values when the magnetization vectors of the two magnetic layers point in substantially the same and opposite directions, respectively. Accordingly, a detection of change in the measured resistance allows a magnetoelectronic information device, such as an MRAM device, to provide information stored in the magnetic memory element.

Typically, a memory element is programmed by a magnetic field created by current flowing through one or more conductors, or programming lines, disposed proximate to the memory element. To program the memory element, the magnetic field applied by the programming line is of sufficient magnitude to switch the direction of the magnetic vectors of one or more magnetic layers of the memory element. Lower programming line currents are desirable to reduce power consumption. Lower programming line currents also translate into smaller write circuits resulting in smaller and less expensive memory array devices. There is an ever-increasing demand for smaller and lower power memory devices.

Accordingly, it is desirable to provide a magnetoelectronic device structure that requires low power for programming. In addition, it is desirable to provide an MRAM device structure that utilizes enhanced magnetic permeability (hereinafter, referred to as "enhanced permeability") materials for reducing the current required to program a memory element of the MRAM device structure. It also is desirable to provide a method for fabricating a dielectric material having enhanced permeability. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention, or the following detailed description of the invention.

Figure 1:
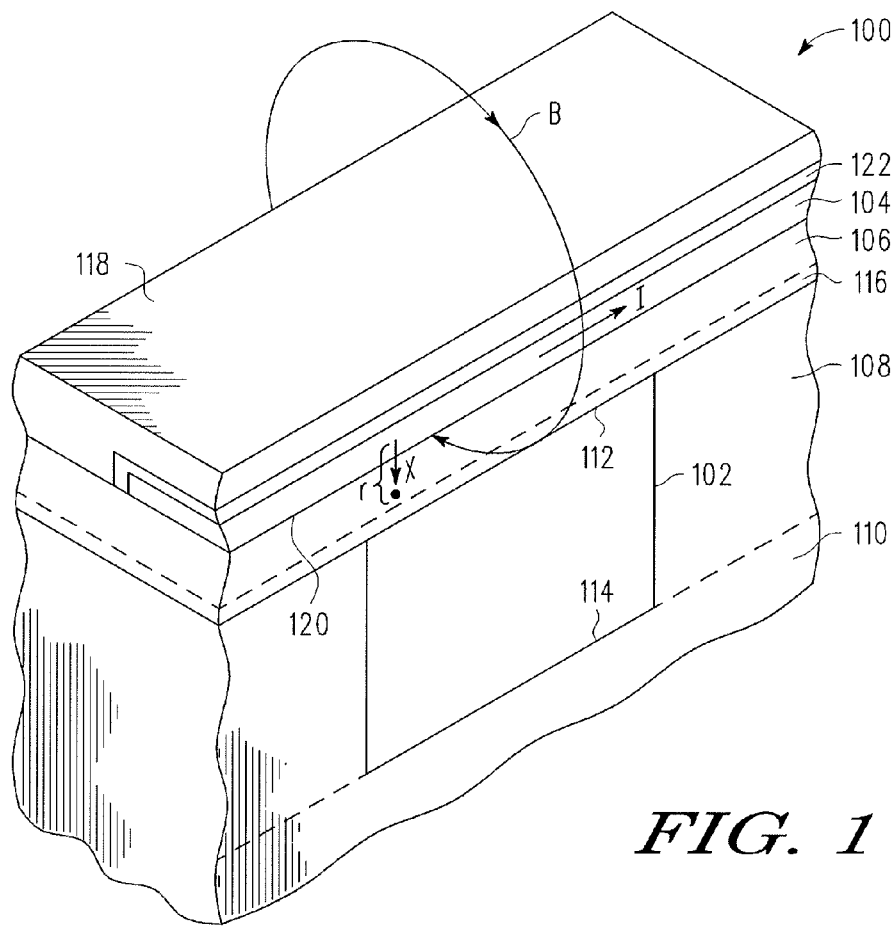
FIG. 1 is a cross-sectional view of a magnetoelectronic device structure in accordance with an exemplary embodiment of the present invention.

Referring to FIG. 1, in accordance with one embodiment of the present invention, a magnetoelectronic device structure 100 comprises a magnetoelectronic device 102 and a conductive programming line 104 disposed proximate to the magnetoelectronic device 102. Magnetoelectronic device 102 may comprise any suitable magnetoelectronic device including, for example, a magnetic sensor or magnetoresistive memory element. Examples of a magnetoelectronic device 102 include a magnetic tunnel junction (MTJ) device or a giant magnetoresistive (GMR) device. Conductive programming line 104 may be formed of any conductive material that is suitable for carrying a current I and is disposed sufficiently close to magnetoelectronic device 102 such that when a current I is carried by conductive programming line 104, the current creates a circumferential magnetic field B about conductive programming line 104 that may be sufficient to change the state of magnetoelectronic device 102. For discussion purposes, conductive programming line 104 is illustrated in FIG. 1 disposed above magnetoelectronic device 102. However, it will be appreciated that conductive programming line 104 may be disposed below magnetoelectronic device 102 or at any other suitable position relative to magnetoelectronic device 102 such that circumferential magnetic field B may be sufficient to change the state of magnetoelectronic device 102.

Disposed between the magnetoelectronic device 102 and the conductive programming line 104 is a first dielectric material layer 106. A second dielectric material layer 108 is disposed about magnetoelectronic device 102. Second material layer 108 may be formed about magnetoelectronic device 102 after fabrication of magnetoelectronic device 102 or may be deposited and etched prior to fabrication of magnetoelectronic device 102, such as during a damascene process. A third dielectric material layer 110 is disposed at a surface 114 of magnetoelectronic device 102 that is opposite a surface 112 proximate to dielectric material layer 106. A fourth dielectric material layer 118 is disposed about conductive programming line 104.

As described above, the magnetic flux B that is applied to magnetoelectronic device 102 from conductive programming line 104 may be of a sufficient magnitude that the state of the magnetoelectronic device 102 may be changed. As is well known in the semiconductor industry, using Ampere's Law, the magnetic field B generated at a point X by current I through conductive programming line 104 may be represented approximately by the equation:

$$B(r) \approx \frac{\mu \times I}{2\pi r},$$

where $\mu$ is the permeability of each of the dielectric material layers 106, 108, 110, and 118 and "r" is the distance from point X to the center of conductive programming line 104. For simplicity, it is assumed that conductive programming line 104 has a circular symmetry and that dielectric material layers 106, 108, 110, and 118 have the same permeability $\mu$. Most non-ferromagnetic materials, including most insulating dielectric materials, have a permeability that is approximately equal to 1. By increasing the permeability of one or more of the dielectric material layer 106, 108, 110, and 118 above 1, the magnetic flux B may be proportionately increased without any increase in current I. Accordingly, by using dielectric material layers having an "enhanced permeability," that is, a permeability greater than about 1, a lower current I may be required to produce magnetic field B. In this manner, a low power magnetoresistive memory element may be fabricated. Examples of methods for achieving "enhanced permeability" are described below.

In an exemplary embodiment of the present invention, magnetoelectronic device structure 100 comprises a first dielectric material layer 106 that has enhanced permeability. In one embodiment of the invention, first dielectric material layer 106 has an enhanced permeability no less than 1.5. In a preferred embodiment of the invention, first dielectric material layer 106 has an enhanced permeability in the range of about 2 to about 60. In a more preferred embodiment of the invention, first dielectric material layer 106 has an enhanced permeability in the range of from about 2 to about 20.

In another exemplary embodiment of the invention, additional material layers 116, represented by dashed lines in FIG. 1, may be disposed between conductive programming line 104 and magnetoelectronic device 102. For example, one or more dielectric material layers in addition to first dielectric material layer 106 may be disposed between conductive programming line 104 and magnetoelectronic device 102. Alternatively, one or more conductive layers may be disposed between conductive programming line 104 and magnetoelectronic device 102. In one exemplary embodiment of the present invention, the additional material layer(s) also exhibits an enhanced permeability that is no less than about 1.5. For example, a metallic layer of tantalum or other metal doped with magnetic particles, such as iron particles, could be deposited between the programming line 104 and the magnetoelectronic device 102. In a preferred embodiment of the invention, the additional layer(s) has a permeability in the range of about 2 to about 60. More preferably, the additional layer(s) has a permeability in the range of from about 2 to about 20. While additional material layer 116 is illustrated in FIG. 1 underlying first dielectric material layer 106, it will be appreciated that additional material layer 116 may be disposed overlying first dielectric material layer 106 or between two dielectric material layers 106.

In a further exemplary embodiment, second material layer 108 that has been formed about magnetoelectronic device 102 or within which magnetoelectronic device 102 has been formed may exhibit an enhanced permeability. When material layer 108 exhibits an enhanced permeability, first material layer 106 may or may not exhibit an enhanced permeability. It will be appreciated that second material layer 108 may be a layer separate from dielectric material layer 106 or may be integral with dielectric material layer 106. Material layer 108 may comprise one layer or a plurality of layers, one or more of which exhibits relative permeability greater than about 1.5.

In a further exemplary embodiment, second material layer 108 and third material layer 110 may exhibit an enhanced permeability such that magnetoelectronic device 102 is at least partially surrounded by material exhibiting an enhanced permeability that is greater than about 1.5. Third material layer 110 may be a layer separate from second material layer 108 or may be integral with second material layer 108.

In another exemplary embodiment, fourth material layer 118 disposed about conductive programming line 104 may exhibit an enhanced permeability. Material layer 118 may comprise one layer or a plurality of layers, one or more of which exhibits permeability greater than about 1.5. Preferably, however, conductive programming line 104 is surrounded on all surfaces, except for a surface 120 most proximate to magnetoelectronic device 102, by a ferromagnetic cladding layer 122. Ferromagnetic cladding layers 122 are well known in the semiconductor industry. Ferromagnetic cladding layer 122 has high intrinsic permeability so that the magnetic field is concentrated in the cladding layer rather than fourth material layer 118. In this manner, the magnetic field below conductive programming line 104 for a given current I may be increased by a factor of 2, with the magnetic field in fourth material layer 118 reduced to approximately zero. Accordingly, fourth material layer 118 may have standard permeability, that is, $\mu=\mu_0=1$.

It will be appreciated that, in a preferred embodiment of the invention, material layers 106, 108 and 110 each have enhanced permeability. The permeability may be the same for each of the layers or the permeability may vary among the layers. In this regard, again using Ampere's Law, the magnetic field at point X may be indicated by the equation:

$$B(r) \approx \frac{\mu \times I}{2\pi r} \times \left(\frac{2}{\mu+1}\right),$$

assuming material layers 106, 108, and 110 each have the same permeability $\mu$ and fourth material layer 118 has standard permeability. Thus, magnetic field B(r) at point X is enhanced by the factor of $2\mu/(\mu+1)$ due to the enhanced permeability of material layers 106, 108, and 110. However, this magnetic field is $2/(\mu+1)$ times smaller than if fourth material layer 118 also had enhanced permeability $\mu$. Accordingly, in a more preferred embodiment of the invention, material layers 106, 108, 110, and 118 each exhibit enhanced permeability, which permeability may be the same for each of the layers or may differ among the layers. In a most preferred embodiment of the invention, material layers 106, 108, and 110 each exhibit enhanced permeability, material layer 118 exhibits standard permeability, that is, $\mu=\mu_0=1$, and programming line 104 is surrounded on three sides by cladding layer 122 so that the magnetic field B(r) at point X is enhanced by the factor of $\mu$.

Figure 2:
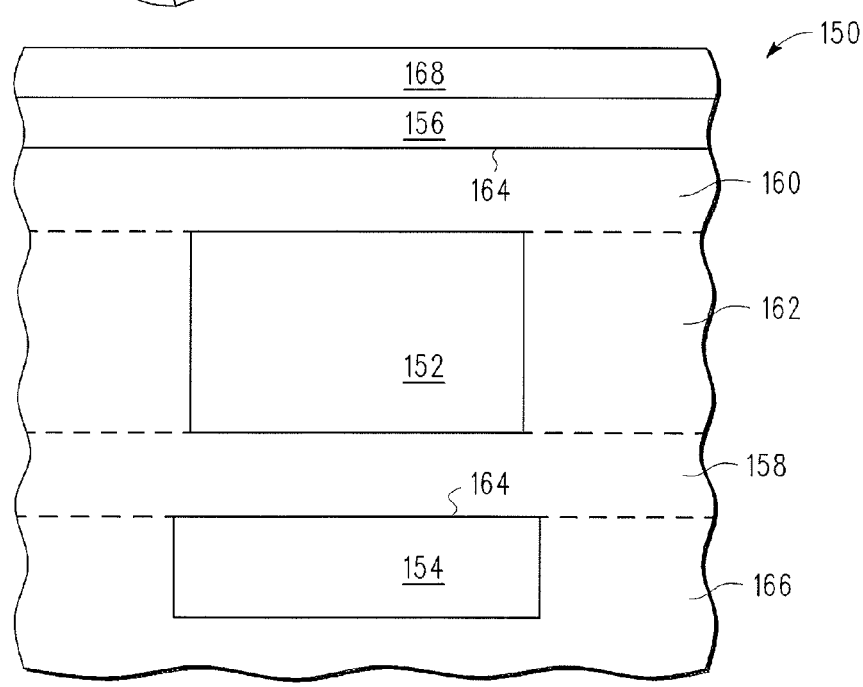
FIG. 2 is a cross-sectional view of a magnetoelectronic device structure in accordance with another exemplary embodiment of the present invention.

FIG. 2 illustrates a magnetoelectronic device structure 150 in accordance with another exemplary embodiment of the present invention. Magnetoelectronic device structure 150 includes a magnetoresistive memory element 152, which may comprise, for example, a magnetic tunnel junction (MTJ) device or a giant magnetoresistive (GMR) device. Magnetoelectronic device structure 150 further comprises a first conductive programming line, referred to herein as digit line 154, disposed below magnetoresistive memory element 152 and a second conductive programming line, referred to herein as bit line 156. Bit line 156 is disposed above magnetoresistive memory element 152 and orthogonal to digit line 154. While for discussion purposes digit line 154 is illustrated in FIG. 2 below magnetoresistive memory element 152 and bit line 156 is illustrated in FIG. 2 above magnetoresistive memory element 152, it should be understood that the opposite positioning may also be utilized, that is, bit line 156 may be disposed underlying magnetoresistive memory element 152 and digit line 154 may be disposed overlying magnetoresistive memory element 152.

In one embodiment of the invention, a first dielectric material layer 158 exhibiting an enhanced permeability no less than about 1.5 may be disposed between digit line 154 and magnetoresistive memory element 152. In another embodiment of the invention, a second dielectric material layer 160 exhibiting an enhanced permeability no less than about 1.5 may be disposed between bit line 156 and magnetoresistive memory element 152. In a further embodiment of the invention, both layer 158 and layer 160 exhibit an enhanced permeability no less than about 1.5. First dielectric material layer 158 and second dielectric material layer 160 may each comprise one layer or a plurality of layers, one or more of which exhibit relative permeability no less than about 1.5. In a preferred embodiment of the invention, first dielectric material layer 158 and/or second dielectric material layer 160 may exhibit a relative permeability in the range of about 2 to about 60. More preferably, first dielectric material layer 158 and/or second dielectric material layer 160 may exhibit a permeability in the range of from about 2 to about 20.

In another exemplary embodiment, a third material layer 162 that has been formed about magnetoresistive memory element 152 or within which magnetoresistive memory element 152 has been formed also may exhibit an enhanced relative permeability no less than about 1.5. In this manner, magnetoresistive memory element 152 may be partially or completely surrounded by material with enhanced permeability so that magnetoresistive memory element 152 may experience enhanced magnetic field from both digit line 154 and bit line 156 without an increase in the current directed through digit line 154 and/or bit line 156. Third material layer 162 may comprise one layer or a plurality of layers, one or more of which exhibits enhanced permeability. In addition, material layer 162 may be a layer separate from first dielectric material layer 158 and/or second dielectric material layer 160 or may be integral with first dielectric material layer 158 and/or second dielectric material layer 160. In a preferred embodiment of the invention, dielectric material layer 162 may exhibit a permeability in the range of about 2 to about 60. More preferably, dielectric material layer 162 may exhibit a permeability in the range of from about 2 to about 20.

In a preferred embodiment of the invention, both digit line 154 and bit line 156 are surrounded at all surfaces, except the surfaces 164 most proximate to memory element 152, by ferromagnetic cladding layers (not shown), as are well known. In this regard, it is not necessary to have materials with enhanced permeability disposed about the cladded surfaces of digit line 154 and bit line 156. However, it will be appreciated that, as described above, in the absence of cladding layers, a material layer (or layers) 166 disposed about digit line 154 may exhibit enhanced permeability. Similarly, a material layer (or layers) 168 disposed about bit line 156 may exhibit enhanced permeability.

Figure 3:
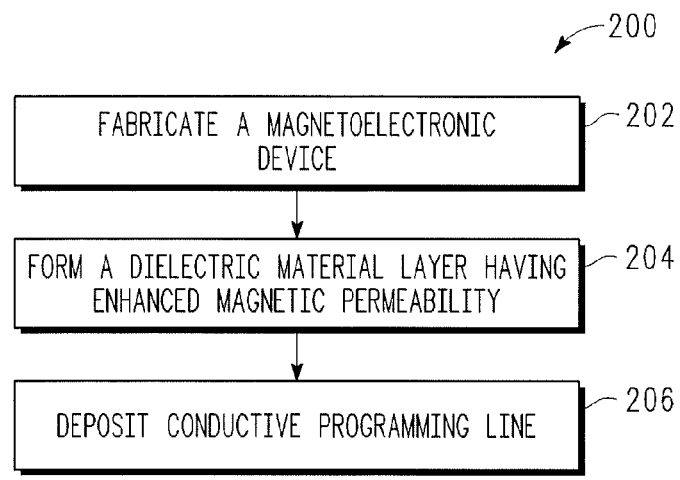
FIG. 3 is a flow chart of a method for fabricating a magnetoelectronic device structure in accordance with another exemplary embodiment of the present invention.

A method 200 for fabricating a magnetoelectronic device structure, such as the magnetoelectronic device structure 100 of FIG. 1, is illustrated in the flow chart of FIG. 3. For sake of convenience, the method 200 will be described with reference to a magnetoelectronic device structure in which a programming line is fabricated above a magnetoelectronic device, with an enhanced permeability dielectric material layer disposed therebetween. However, it should be appreciated that the method 200 is not so limited, and may be utilized to fabricate a magnetoelectronic device structure comprising a magnetoelectronic device disposed above, or along side of, a programming line, with enhanced permeability material disposed adjacent to the magnetoelectronic device and/or the programming line.

Method 200 of FIG. 3 may commence by fabricating a magnetoelectronic device, such as magnetoelectronic device 102 of FIG. 1 (step 202). The magnetoelectronic device may be fabricated by any suitable methods or practices known in the semiconductor industry. For example, the magnetoelectronic device may be formed by a damascene or other similar process in which the various layers and structures of the magnetoelectronic device are deposited in a trench formed within a dielectric material. Alternatively, the various layers and structures of the magnetoelectronic device may be formed on a dielectric material or other substrate and suitably etched to form the magnetoelectronic device. In one embodiment of the invention, the magnetoelectronic device is fabricated such that the material disposed proximate to a bottom surface and side surfaces of the magnetoelectronic device exhibits enhanced permeability, as described in more detail below.

After fabrication of the magnetoelectronic device, a dielectric material layer that exhibits enhanced magnetic permeability is formed overlying the magnetoelectronic device (step 204). The enhanced permeability dielectric material layer may be formed by any suitable process or procedure, such as, for example, plasma vapor deposition (PVD), ion beam deposition (IBD), chemical vapor deposition (CVD), evaporation deposition, and the like. Preferably, the dielectric material layer is formed by a process or procedure that does not utilize temperatures greater than 500° C. Temperatures above 500° C. may degrade the magnetic properties of the materials that comprise the magnetoelectronic device.

In accordance with one embodiment of the present invention, the enhanced permeability dielectric material may be formed by the method of co-sputtering utilizing at least one dielectric material source and at least one magnetic material source. Co-sputtering is a well-known process and thus will not be described in detail here. The dielectric material source may comprise any suitable dielectric, such as alumina ($AlO_x$), where X may be any number greater than zero, silicon oxide, silicon dioxide, oxides of magnesium, hafnium, tantalum, titanium, vanadium, or niobium, and the like. The source or sources of magnetic material may comprise any suitable magnetic material, such as, for example, nickel, iron, cobalt, and/or alloys of nickel, iron and/or cobalt, including nickel-iron, cobalt-iron, cobalt-iron-boron, nickel-iron-cobalt, and the like. The relative fluxes of the dielectric material(s) and the magnetic material(s) may be increased or decreased so that an enhanced permeability dielectric material having a desired enhanced magnetic permeability is deposited.

Figure 4:
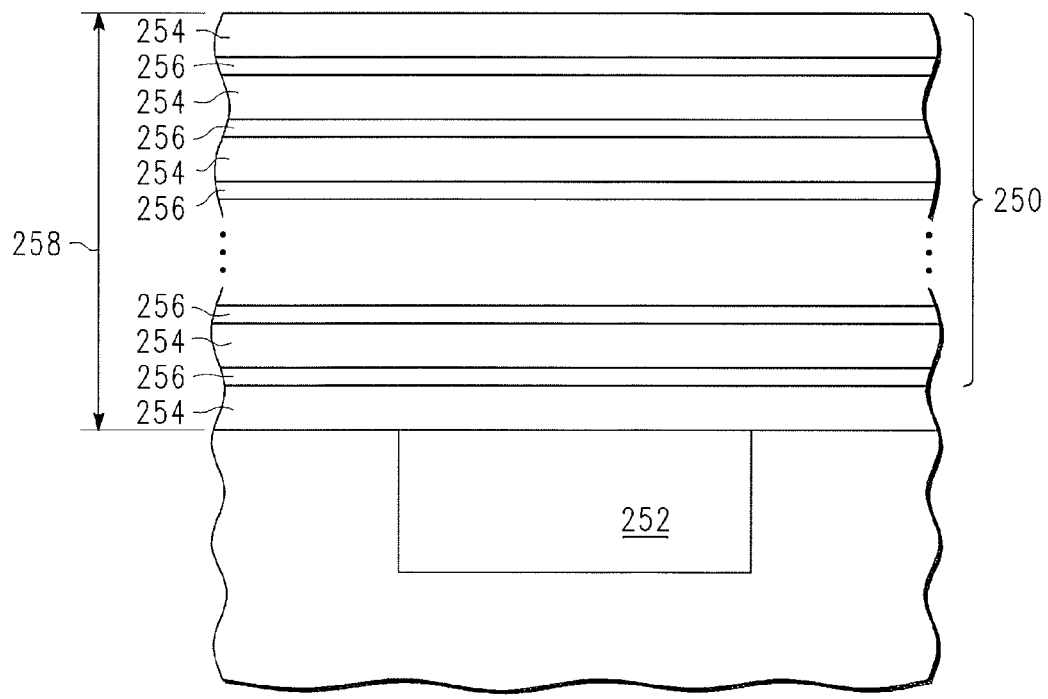
FIG. 4 is a cross-sectional view of a partial magnetoelectronic device structure in accordance with a further exemplary embodiment of the present invention.

Referring to FIG. 4, in another embodiment of the invention, a dielectric material layer 250 that exhibits enhanced permeability no less than about 1.5 may be formed overlying or underlying a magnetoelectronic device 252 by the alternating deposition of a dielectric material (or materials) 254 and magnetic material 256 to form a multilayer stack. The dielectric material(s) may comprise any suitable dielectric material, such as alumina ($AlO_x$), where X may be any number greater than zero, silicon oxide, silicon dioxide, oxides of magnesium, hafnium, tantalum, titanium, vanadium, or niobium, and the like. The magnetic material(s) may comprise any suitable magnetic material, such as, for example, nickel, iron, cobalt, and/or alloys of nickel, iron and/or cobalt, including nickel-iron, cobalt-iron, cobalt-iron-boron, nickel-iron-cobalt, and the like. The layers of deposited dielectric material 254 may each comprise the same dielectric material, or may comprise different dielectric materials. Similarly, the layers of magnetic material 256 may each comprise the same magnetic material, or may comprise different magnetic materials. The uppermost layer of the resulting enhanced permeability dielectric material layer 250 may comprise either a dielectric material layer 254 or a magnetic material layer 256. The deposition may be performed using any suitable, known process, such as, for example, PVD, IBD, CVD, evaporation deposition, and the like. The alternating deposition of dielectric material layers 254 and magnetic layers 256 is performed until the multilayer stack 250 has a desired or predetermined thickness 258.

In multilayer stack 250, the magnetic layers 256 preferably are deposited such that magnetic nano-particles form during or after deposition. The nano-particles are sufficiently small in size that they are superparamagnetic. A magnetic particle is "superparamagnetic" when its energy barrier to magnetization reversal $E_b$ is comparable to thermal energy $k_bT$ such that $E_b/k_bT \leq 1$, where $k_b$ is Boltzman's constant and T is the temperature of the nano-particle. When this occurs, the thermal energy effectively demagnetizes the nano-particle almost instantaneously so that it has zero coercivity and zero magnetic remanence. The energy barrier $E_b$ may be expressed as $E_b \approx M_S V H_k/2$, where $M_S$ is the saturation magnetization of the nano-particle, V is the volume of the nano-particle, and $H_k$ is the magnetic anisotropy, which is the sum of any intrinsic material anisotropy and any shape anisotropy due to particle shape deviating from spherical. Accordingly, for spherical nano-particles of Ni, Fe, or Co alloys (Ms~1000 kA/m), where $H_k \leq 20$ Oe, the nano-particles will be superparamagnetic when the diameter of the nano-particle is no greater than 20 nm. In one embodiment of the present invention, the nano-particles have a size in the range of about 2 to about 10 nm. Preferably, the nano-particles have a size in the range of about 2 to about 5 mn.

It should be appreciated that in a preferred embodiment a layer of nano-particles is a discontinuous layer of nonjoining "islands" or dots of material that maintain super-paramagnetic properties. In other words, the non-joining "islands" or dots of material that maintain superparamagnetic properties may be magnetic particles embedded in a dielectric matrix. In this embodiment, because the deposited magnetic material agglomerates into particles, rather than forming a continuous layer, the height (or diameter) of the particles is much greater than the average thickness of material deposited to form the nano-particle layer.

The layers of the deposited dielectric material(s) 254 are substantially thicker than the layers of the nano-particles 256 which lie therebetween. In one embodiment of the invention, the dielectric material layers are about 1 to 15 times thicker than the average thickness of magnetic material deposited to form layers 256. In a preferred embodiment of the invention, the dielectric material layers 254 are about 2 times thicker than the magnetic layers 256.

One example of forming an enhanced permeability dielectric material, in accordance with an exemplary embodiment of the present invention, using the alternating deposition process described above may begin with the reactive sputtering of a dielectric material, such as alumina. In this example, aluminum may be deposited overlying the magnetoelectronic device in the presence of a suitable oxygen flow to form an alumina layer having any suitable stoichiometry such that the alumina layer exhibits insulating dielectric properties. The reactive sputtering process is a well known process and will not be described in detail here. Preferably, the reactive sputtering process is performed at temperatures no greater than 500° C. so that the magnetic properties of the magnetoelectronic devices are not compromised. The reactive sputtering process may proceed until a desired or predetermined thickness of alumina is deposited overlying the magnetoelectronic device. Preferably, the alumina layer has a thickness of less than about 50 angstroms and more preferably has a thickness of about 25 angstroms.

After the deposition of the alumina layer, cobalt-iron (CoFe) nano-particles exhibiting superparamagnetic properties are formed overlying the alumina layer using PVD. The CoFe is deposited such that a discontinuous layer of CoFe nano-particles is formed over the alumina layer. Preferably, the PVD process is performed until the discontinuous nano-particle layer has an average thickness in the range of about 5 to about 20 angstroms.

The reactive sputtering process again is performed to form a second alumina layer overlying the CoFe nano-particles. The second alumina layer preferably has a thickness that is the same thickness as the first alumina layer, that is, preferably about 25 angstroms. PVD then is performed to form a second discontinuous layer of CoFe nano-particles overlying the second alumina layer. The second CoFe nano-particle layer preferably has a thickness that is the same thickness as the first CoFe nano-particle layer, that is, preferably about 5 to about 20 angstroms. The reactive sputtering process and the PVD process then are repeated alternately to form a multi-layer stack having a desired or predetermined thickness. The uppermost layer of the enhanced relative permeability dielectric material may comprise either a discontinuous CoFe layer or an alumina layer.

It will be appreciated that, while the above example began with a reactive sputtering step to deposit a dielectric material layer, followed by a PVD step to deposit a discontinuous nano-particle layer, the steps could be performed in an alternate sequence. That is, the enhanced relative permeability dielectric material layer, such as dielectric material layer 250 of FIG. 4, may be formed by first depositing a discontinuous nano-particle layer. Then, a dielectric material layer could be deposited overlying the discontinuous nano-particle layer. This sequence of steps then could be performed alternately until a multilayer stack having a desired or predetermine thickness is obtained.

Figure 5:
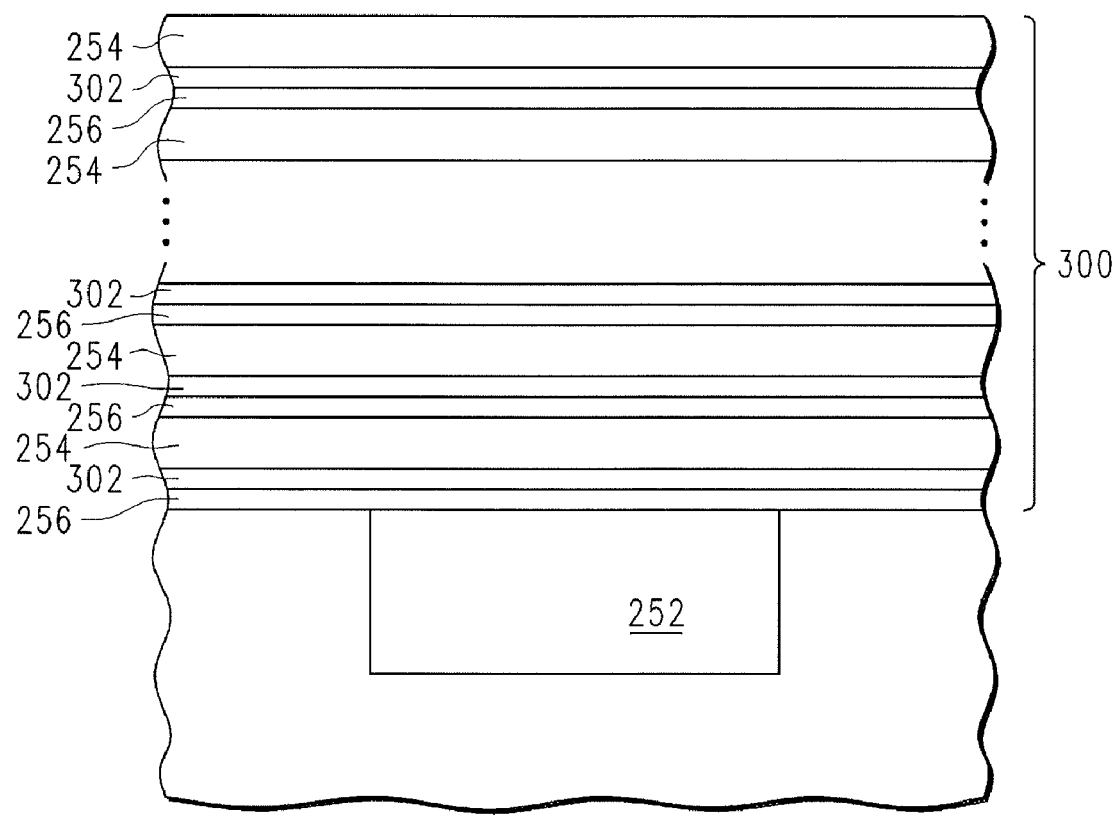
FIG. 5 is a cross-sectional view of a partial magnetoelectronic device structure in accordance with yet another exemplary embodiment of the present invention.

Referring to FIG. 5, in another exemplary embodiment of the invention, an enhanced permeability dielectric material layer 300 may further comprise a material that serves as a barrier to oxidation of the nano-particle layers 256. In this embodiment, enhanced permeability dielectric material layer 300 may be formed using the alternating deposition of dielectric material layers, such as dielectric material layers 254 of FIG. 4, and discontinuous nano-particle layers, such as nano-particle layers 256 of FIG. 4, as described above, but with the additional deposition over each nano-particle layer 256 of a layer 302 of material that serves as a barrier to oxidation of the nano-particle layers 256. For example, when the dielectric material 254 comprises alumina, as in the above described example, the oxidation barrier material layers 302 may be, for example, aluminum. As the alumina layers 254 are formed during the reactive sputtering steps, the CoFe nano-particle layers 256 may be exposed to oxygen. Without an oxidation barrier layer, the CoFe nano-particle layers may begin to oxidize, which could degrade or otherwise compromise the super-paramagnetic properties of the CoFe nano-particle layers. An oxidation barrier layer 302 of aluminum overlying each of the CoFe nano-particle layers may serve to react with any oxygen that may otherwise oxidize the CoFe nano-particle layers. In addition, upon oxidation, the oxidation barrier layer 302 becomes non-conducting, thus contributing to the insulating dielectric nature of the multilayer stack. In one embodiment, the oxidation barrier layers 302 have a thickness no greater than 20 angstroms. In a preferred embodiment of the invention, the oxidation barrier layers 302 have a thickness in the range of about 5 to about 10 angstroms. While in FIG. 5, oxidation barrier layer 302 is illustrated as being located only on one side of CoFe nano-particle layer 256, in a still further exemplary embodiment, an oxidation barrier layer equivalent to layer 302 may be provided on both sides of CoFe nano-particle layer 256. Either arrangement is useful.

Returning again to FIG. 3, after deposition of the enhanced permeability dielectric material layer overlying the magneto-electronic device, a conductive programming line may be deposited overlying the dielectric material layer (step 206). The conductive programming line may be formed utilizing any suitable process or procedure known in the semiconductor industry. For example, the conductive programming line may be formed by etching one or more than one conductive material layer deposited overlying the enhanced permeability dielectric material layer. Alternatively, the conductive programming line may be formed by the deposition of a conductive material or materials deposited in a trench etched into the enhanced permeability dielectric material layer or into another insulating material layer deposited overlying the enhanced permeability dielectric material layer.

Figure 6:
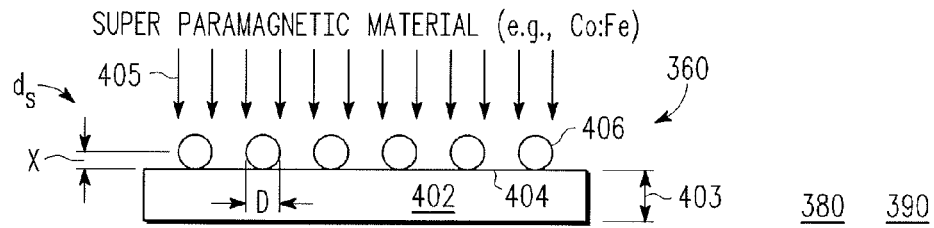
FIGS. 6-8 are simplified cross-sectional views of a portion of a magnetoelectronic device structure during formation of enhanced permeability dielectric (EPD) layers according to a yet further exemplary embodiment of the invention.
Figure 7:
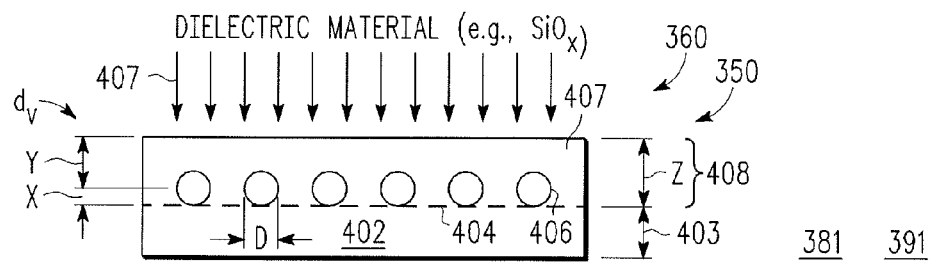
Figure 8:
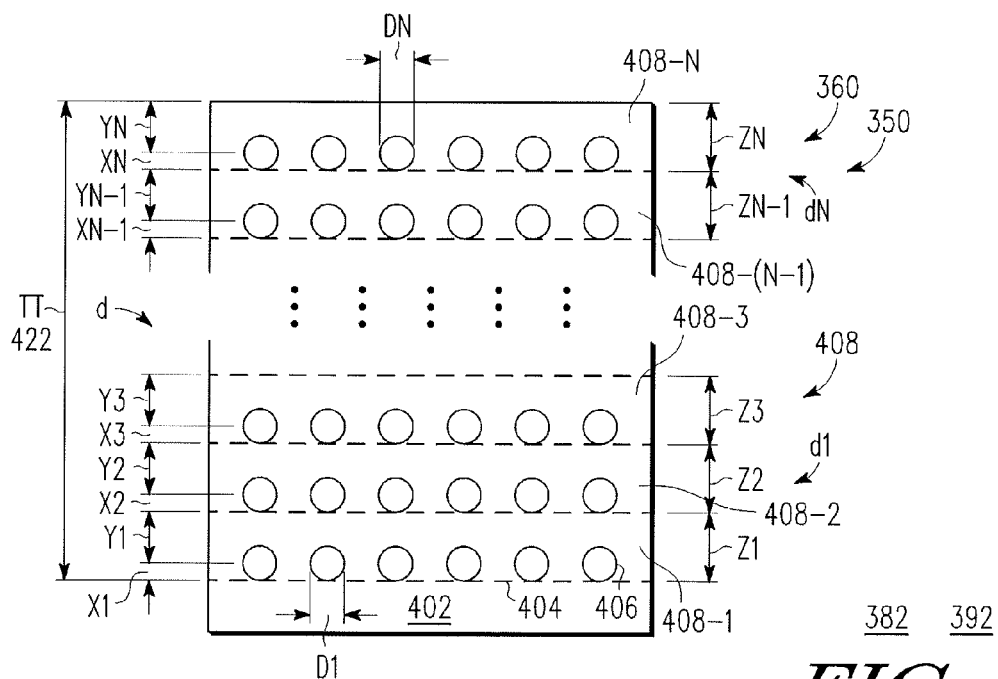

It has been discovered that the properties of the enhanced permeability dielectric (EPD) materials for use in layers or regions 106, 108, 110, 118, of FIG. 1 and/or layers or regions 158, 160, 162, 166, 168, of FIG. 2, for example, can be enhanced by controlling the deposition conditions and structure of the EPD materials. FIGS. 6-8 are simplified cross-sectional views of portion 360 of a magnetoelectronic device structure during formation of enhanced permeability dielectric (EPD) layers (e.g., layers 106, 108, 110, 118 of FIG. 1, and/or layers 158, 160, 162, 166, 168 of FIG. 2, collectively layer 350) according to a yet further exemplary embodiments of the invention. FIG. 6 illustrates manufacturing stage 380. Portion 360 comprises substrate or underlying layer or material 402, preferably but not essentially a dielectric material. Layer 402 can be quite thin, as for example and not intended to be limiting, with thickness 403 of the order of 1-10 nanometers or larger. Silicon oxide and aluminum oxide are non-limiting examples of suitable materials for layer or substrate 402, but other dielectric materials may also be used. Substrate 402 may be a layer deposited on a digit or bit line or on a material laterally outside of a magnetic memory bit.

In fabrication stage 380 of FIG. 6, magnetic material 405 adapted to form super-paramagnetic nano-particles 406 on surface 404 of substrate 402 is deposited on surface 404, as for example, by physical vapor deposition (PVD). Sputtering is a non-limiting example of a suitable physical vapor deposition process. CoFe is a non-limiting example of a suitable magnetic material, but other magnetic materials, such as for example, those that have been noted earlier that form super-paramagnetic layers or nano-particles of superparamagnetic material, can also be used. DC sputtering in argon plasma using a CoFe target is a suitable PVD process for such magnetic material. The average thickness X of the deposited magnetic material is used as a convenient control parameter for the fabrication process. However, rather than forming a uniform coating on surface 404, magnetic material 405 tends to form discrete nano-particles approximately of diameter D on surface 404, as is schematically illustrated in FIG. 6. Diameter D is usefully in the range of about 2 to 10 nanometers, but larger values can also be used. Electron microscope studies show that the distribution of nano-particles 406 is approximately uniform and that they have substantially similar diameters D for similar deposition conditions. In general, the greater the average thickness X of magnetic material deposited on surface 404, the larger the diameter D and/or the higher the density d of the nano-particles that form on surface 404. With respect to a surface, the nano-particle surface density $d_s$ is the number of particles per unit area of surface. Within a volume of material, the nano-particle volume density $d_v$ is the number of particles per unit volume. Hereafter, $d_s$ and $d_v$ are collectively referred to as particle density d. Changing the average thickness of magnetic material can result in a change in the diameter D or a change in the density d of nano-particles (e.g., more or fewer particles per unit area or per unit volume) or a combination of both effects. Changes in the diameter D or density d of the nano-particles will affect the permeability $\mu$, since it can be shown for superparamagnetic particles that $\mu$ is approximately proportional to $d*D^6$.

It is sometimes difficult to accurately measure the particle diameter D and/or the particle density d, hence the average thickness X of magnetic material is adopted as a parameter than can be controlled during deposition and measured after deposition from the physical properties of the resulting material. After a predetermined average thickness X of magnetic material 405 has been deposited on surface 404, structure 390 results.

Fabrication stage 381 illustrated in FIG. 7 is then employed, wherein dielectric material 407 is deposited to average thickness Y over nano-particles 406 and any exposed portions of surface 404 to form composite layer 408 containing nano-particles 406 embedded in dielectric material 407. Silicon oxide (e.g., SiOx), aluminum oxide (e.g., $Al_2O_2$) and other well known dielectrics are useful for forming composite layer 408. RF sputtering in argon from an $SiO_2$ target is preferred for providing dielectric material 407, but other well known techniques can also be used. Structure 391 results.

In fabrication stage 382 of FIG. 8, fabrication stages 380 and 381 are repeated, thereby building up successive layers 408-1, 408-2, 408-3 . . . 408-i . . . 408-N, as many as are desired. First layer 408-1 has average magnetic material thickness X1, average dielectric thickness Y1 and average total thickness Z1, and contains nano-particles 406-1 substantially of diameter D1 and density d1. Second layer 408-2 has average magnetic material thickness X2, average dielectric thickness Y2 and average total thickness Z2, and contains nano-particles 406-2 substantially of diameter D2 and density d2. Third layer 408-3 has average magnetic material thickness X3, average dielectric thickness Y3 and average total thickness Z3, and contains nano-particles 406-3 substantially of diameter D3 and density d3, and so forth for as many composite layers of total thickness (TT) 422, as are desired. X and Y and/or the ratio R=X/Y may be varied in each layer or in groups of layers, or may be the same throughout TT 422, according to the desires of the device designer.

Figure 9:
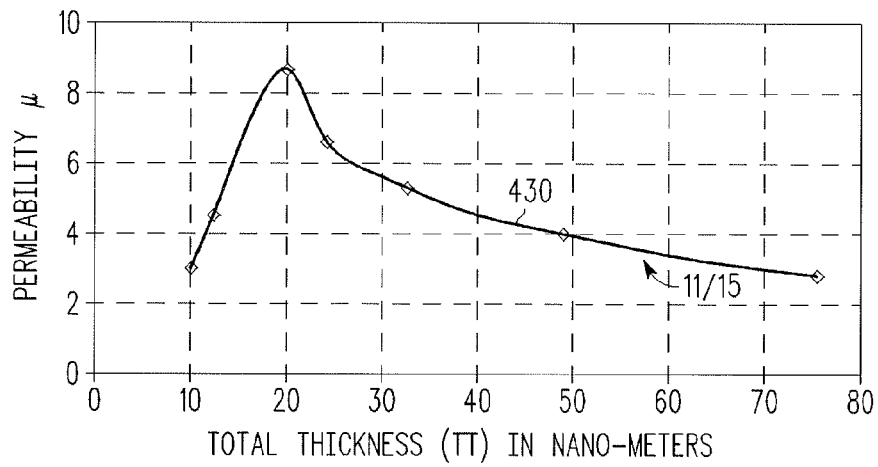
FIGS. 9, and 11-12 are plots of permeability $\mu$ of EPD layers formed in the manner illustrated in FIGS. 6-8 as a function of overall EPD layer thickness for different average deposition thickness ratios of superparamagnetic material to dielectric material in successive layers, according to still further exemplary embodiments of the invention.
Figure 11:
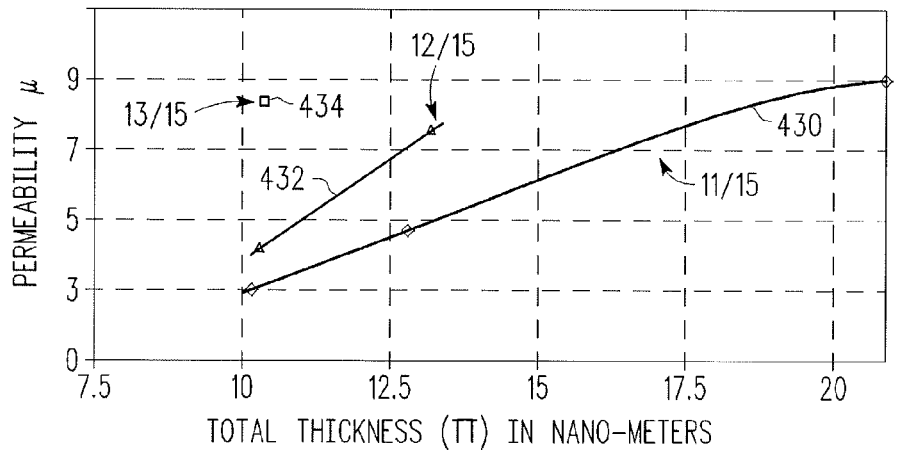
Figure 12:
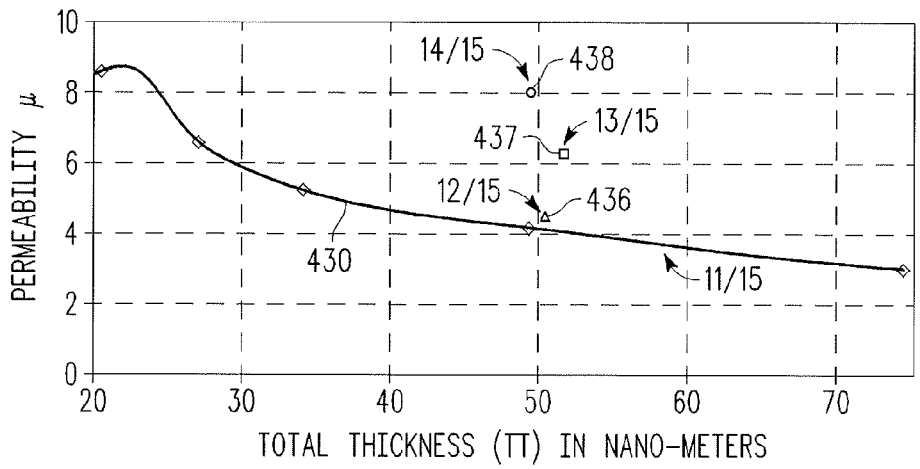

It has been found that the magnetic permeability of the enhanced permeability dielectric (EPD) layers depends upon the ratio R=X/Y and to some extent on the magnitude of X and Y. Also, other properties of the EPD layers, e.g., dielectric breakdown strength and leakage, also depend upon these parameters. FIGS. 9 and 11-12 are plots of permeability $\mu$ of EPD layers formed in the manner illustrated in FIGS. 6-8 as a function of the total thickness TT, for various average deposition thickness ratios of superparamagnetic material to dielectric material in successive layers, according to still further exemplary embodiments of the invention. In FIGS. 9 and 11-12, the same average dielectric thickness (e.g., Y=1.5 nano-meters) was used for successive layers while the average thicknesses X of superparamagnetic material was varied, as indicated by the different ratios R=X/Y, e.g., 11/15, 12/15, 13/15, etc., for the various data points or traces.

Referring now to FIG. 9, trace 430 shows how permeability $\mu$ of the overall EPD layer changes as a function of total thickness TT, formed by depositing a succession of layers 408-1 . . . 408-N as illustrated in FIGS. 6-8, where N takes on successively larger values. In FIG. 9, a ratio R=X/Y=11/15 was used for each of the N layers making up the total thickness TT. For convenience of description, the convention is adopted of expressing the X/Y ratio in whole numbers in Angstrom Units. Thus, R=X/Y=11/15 indicates that the magnetic material formed as in FIG. 6 had an average thickness of X=11 Angstrom Units (or 1.1 nano-meters) and the dielectric material formed as in FIG. 7 had an average thickness of Y=15 Angstrom Units (or 1.5 nano-meters), whereby each composite layer 408-i (i=1, 2, 3 . . . N) had an average thickness Z=X+Y. Thus, for N=10 a total layer thickness TT~10*(1.1+1.5)~26 nano-meters is expected, for N=20 then TT~52 nano-meters is expected, and so forth. Accordingly, thicker or thinner EPD layers are obtained by using smaller or larger values of N. Since the ratio R=X/Y=11/15 is the same for all of layers 408-1 . . . 408-N in FIG. 9, one would ordinarily expect that the permeability $\mu$ should be substantially the same throughout the total thickness. But that is not what is observed. It will be noted from trace 430, that the permeability $\mu$ of the overall EPD layer has a maximal value of $\mu$~8.6 at total thickness TT of about 20 nano-meters, Stated another way, the permeability $\mu$ has a maximum for N of about 7 to 8 and is less for smaller or larger values of N. This is an unexpected result.

Figure 10:
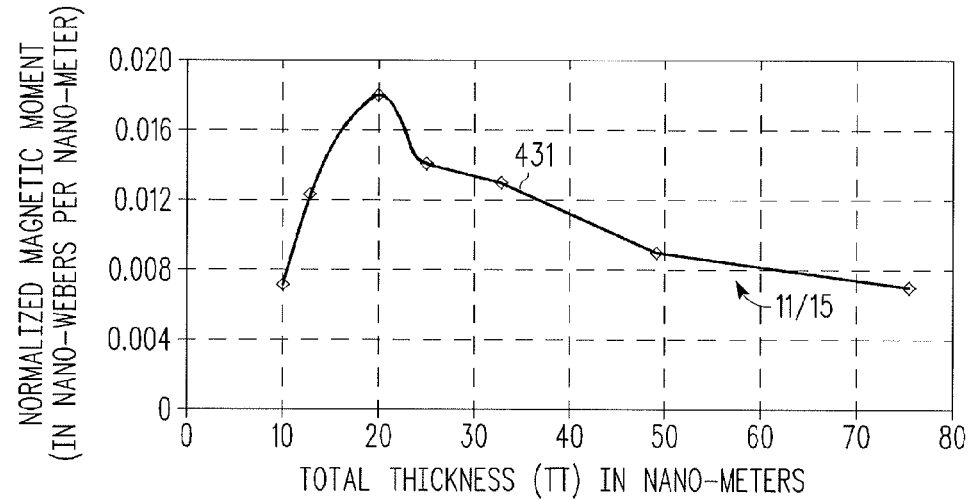
FIG. 10 is a plot of the ratio of the total saturation magnetic moment divided by the total thickness of the EPD layers versus the total thickness of the EPD layers, for the same films whose permeability $\mu$ is illustrated in FIG. 9.

FIG. 10 is a plot of trace 431 showing the ratio of the total saturation magnetic moment in nano-Webers divided by the total thickness of the EPD layers in nano-meters associated with each measured value of the magnetic moment, versus the total thickness of the EPD layers in nano-meters, for the same films whose permeability $\mu$ is illustrated in FIG. 9. This ratio is also referred to as the Normalized Magnetic Moment (NMM). A plot of the NMM versus thickness should be constant as a function of thickness if all the magnetic material (e.g., CoFe) in the EPD layer were remaining magnetic. However, trace 431 of FIG. 10 is similar in shape to trace 430 of FIG. 9, increasing until approximately 20 nano-meters total thickness and decreasing thereafter. Therefore, the amount of CoFe remaining magnetic in a given composite layer is changing as a function the total EPD layer thickness, i.e., as more and more composite layers are added to form the EPD. As noted in connection with FIG. 9, this is an unexpected result.

In FIG. 11, the thickness scale has been expanded to look more closely at the permeability $\mu$ for total thicknesses TT in the range of about 10 to 20 nano-meters. The initial part of trace 430 for TT of about 10 to 20 nanometers is included in FIG. 10 as well as trace 432 for X/Y=12/15 and data point 434 for X/Y=13/15. It will be noted that increasing the average thickness of the magnetic material relative to the average dielectric thickness results in higher permeability $\mu$ values. This is consistent with the expectation that larger average values of X produce nano-particles of larger diameter D and/or higher density d or both, which is expected to increase the overall permeability $\mu$ of the resulting EPD layers. Note from trace 432 that while the permeability $\mu$ is higher for a given total thickness (TT), it still depends upon the total thickness TT even though the X/Y ratio is constant for individual layers 408-1 . . . 408-N making up the total thickness TT.

In FIG. 12, the thickness scale has been expanded to look more closely at the permeability $\mu$ for total thicknesses TT in the range of about 20 to 80 nano-meters. The portion of trace 430 between TT of about 20 to about 80 nano-meters is included in FIG. 11 as well as data point 436 for X/Y=12/15, data point 437 for X/Y=13/15 and data point 438 for X/Y=14/15. Again, increasing the relative average thickness of magnetic material to dielectric material can increase the permeability $\mu$. By comparing the data presented on FIGS. 11 and 12, it can be seen that an EPD region with R=X/Y=12/15 exhibits a maximum value of permeability $\mu$ at a total thickness TT value between about 13 nano-meters (see FIG. 11) and about 50 nano-meters (see FIG. 12). Similarly, an EPD region with R=X/Y=13/15 exhibits a maximum value of permeability $\mu$ at a total thickness TT value between about 10.5 nanometers (see FIG. 11) and about 52 nano-meters (see FIG. 12). The permeability $\mu$ for data point 438 for R=X/Y=14/15 at TT~50 nano-meters is close to the maximum obtained for R=X/Y=11/15 at TT~20 nano-meters.

Figure 13:
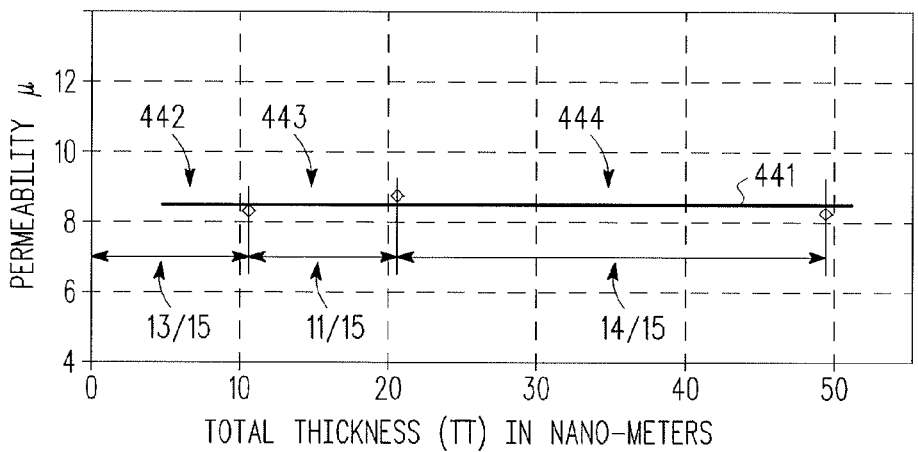
FIG. 13 is a plot of permeability $\mu$ of enhanced permeability dielectric layers formed in the manner illustrated in FIGS. 6-8 as a function of overall layer thickness illustrating how appropriate variation of the average deposition thickness ratios of superparamagnetic material to dielectric material in successive layers can be used to produce substantially uniform permeability as a function of overall layer thickness, according to still yet further exemplary embodiments of the invention.

FIG. 13 is a plot of permeability μ of enhanced permeability dielectric layers formed in the manner illustrated in FIGS. 6-8 as a function of total layer thickness (TT), illustrating how appropriate variation of the average deposition thickness ratios R=X/Y of superparamagnetic material to dielectric material in successive layers 408-1 to 408-N can be used to produce substantially uniform permeability μ (see trace 441) as a function of total thickness TT, according to still yet further exemplary embodiments of the invention. For example, in the range of TT=0 to ~10 nano-meters (region 442), R=X/Y is set to about 13/15. For TT of ~10 to ~20 nano-meters (region 443), R=X/Y is set to about 11/15 and for TT of 20 to ~50 nano-meters (region 444), R=X/Y of about 14/15 is used. Stated another way, for about the first 3-4 composite layers 408-i (e.g., i=1 to 3-4) in region 442, R=X/Y=13/15. For the next ~4 composite layers 408-i (e.g., i=3-4 to 7-8) in region 443, R=X/Y=11/15 is used. And, for the next ~10 composite layers 408-i (e.g., i=7-8 to 17-18) in region 444, R=X/Y=14/15 is used. It will be noted in FIG. 12, that by varying the ratio R=X/Y as a function of total thickness (TT), the permeability μ can be made substantially constant throughout the multilayered structure for any total thickness (TT) in the range from about TT~10 to TT~50 nano-meters (see trace 441). The concept of varying the ratio R=X/Y in different regions of the overall EPD layer to produce a more uniform permeability μ in different parts of the same EPD material has not been previously known. Persons of skill in the art will understand based on the description herein that, not only can substantially uniform permeability EPD layers be obtained by applying the principles taught herein, but EPD layers having other predetermined permeability profiles can also be obtained. For example and not intended to be limiting, trace 441 can be made to tilt up with increasing thickness or tilt down with increasing thickness or have a peaked shape or have a valley-like shape and/or a combination thereof, by varying the ratio R=X/Y in a predetermined manner during formation of successive EPD layers making up the total EPD layer thickness. This is a new capability.

Figure 14:
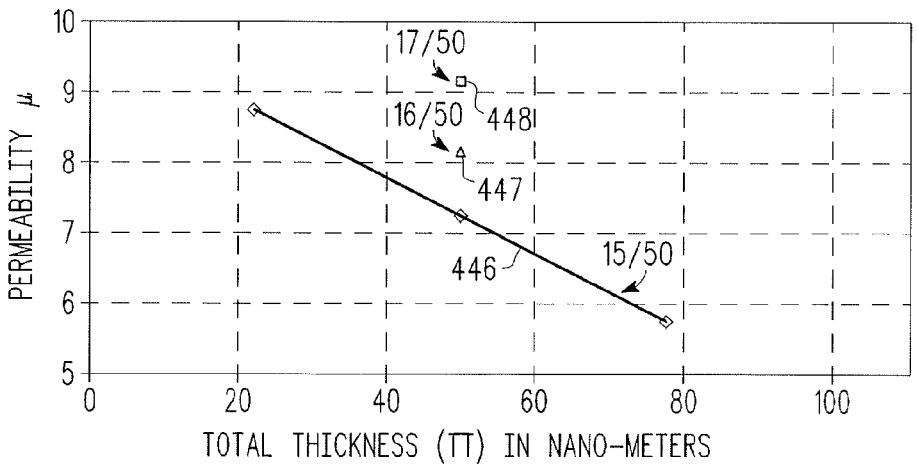
FIG. 14 is a plot of permeability $\mu$ of enhanced permeability dielectric layers formed in the manner illustrated in FIGS. 6-8 as a function of overall layer thickness illustrating how further variations of the average deposition thickness and thickness ratios in successive layers can be extended to a different average dielectric thickness, according to yet still further exemplary embodiments of the invention.

FIG. 14 is a plot of permeability μ of EPD layers formed in the manner illustrated in FIGS. 6-8 as a function of overall layer thickness TT, illustrating how further variations of the average deposition thicknesses and thickness ratios in successive layers can be extended to a different average dielectric thickness (for example, 5.0 nm) and achieve similar results analogous to those as illustrated in FIGS. 9, 11-13, according to yet still further exemplary embodiments of the invention. The average thickness Y of dielectric material 407 was increased by about 333% and average thicknesses of magnetic material 405 was increased in the range of about 135 to 155%, compared to the settings used, for example in FIG. 9. Trace 446 was obtained for R=X/Y=15/50 for TT of about 25 to 75 nano-meters. Data point 447 was obtained for R=X/Y=16/50 at TT~50 nano-meters and data point 448 was obtained for R=X/Y=17/50 also at about TT~50 nano-meters. The observations noted in connection with FIGS. 9 and 11-13 are also apparent here, that is, that permeability μ of EPD layers depends upon the total thickness TT for constant ratios R=X/Y, and that increasing X relative to Y tends to increase the permeability μ at the same total thickness TT.

While using larger values of X to obtain higher permeability μ values for the EPD multilayers is desirable, other physical effects limit what can be used in practical devices. For example, as the average amount of magnetic material X is increased in composite layers 408, the electrical leakage can increase and the breakdown voltage of the EPD regions formed from multiple layers 408-i can decrease. Both of these consequences can adversely affect the electrical properties of the magnetic memory bit (e.g., bit 102 of FIG. 1 and/or bit 152 of FIG. 2), whose programming current the adjacent EPD regions (e.g., regions or layers 106, 108, 110, 118 of FIG. 1, and/or layers 158, 160, 162, 166, 168) are intended to reduce. However, the data in FIGS. 9-14 and the teachings presented herein can be used to provide composite EPD regions or layers with improved magnetic properties without sacrificing essential electrical properties, as is explained in connection with FIGS. 15-19, following.

Figure 15:
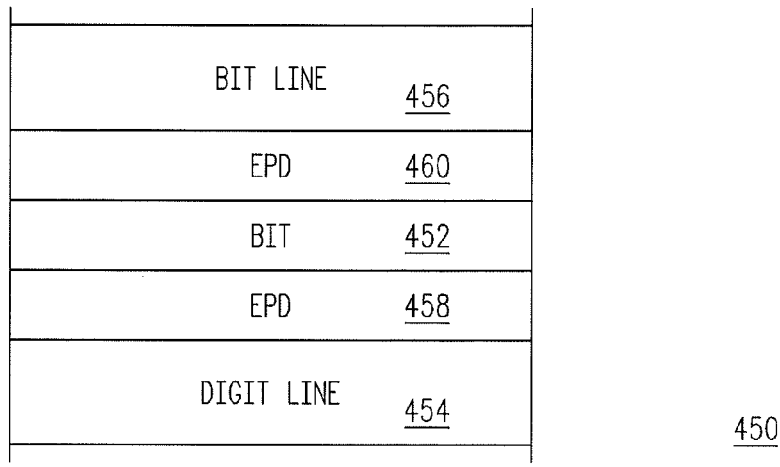
FIGS. 15-16 illustrate schematically, enhanced permeability device structures according to still further embodiments of the invention.
Figure 16:
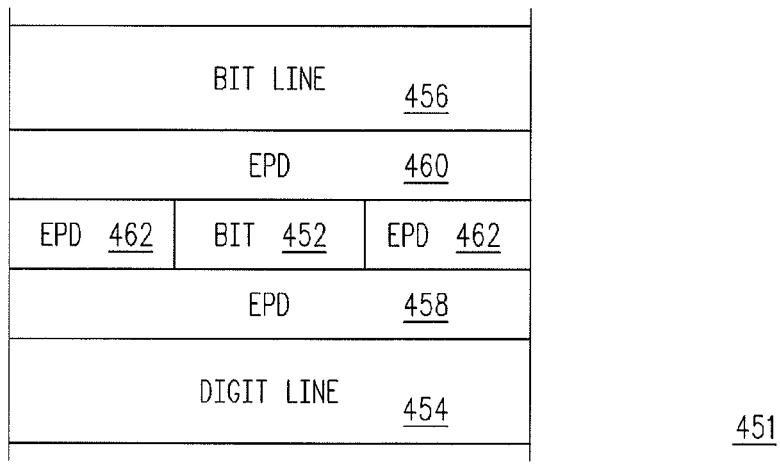

FIGS. 15-16 illustrate schematically, enhanced permeability device structures 450, 451 in which enhanced permeability dielectric (EPD) layer 458 is provided between underlying digit line 454 and magnetic memory bit 452, and in which EPD layer 460 is provided between overlying bit line 456 and magnetic memory bit 452 (FIG. 15), and EPD region 462 may also be provided laterally outside of memory bit 452 (FIG. 16), according to still further embodiments of the invention. Digit line 454 of FIGS. 15-16 is analogous to digit line 154 of FIG. 2, EPD layer 458 is analogous to EPD layer 158 of FIG. 2 and EPD layer 110 of FIG. 1, magnetic memory bit 452 of FIGS. 15-16 is analogous to bit 152 of FIG. 2 and bit 102 of FIG. 1, EPD region 462 of FIG. 16 is analogous to region 162 of FIG. 2 and region 108 of FIG. 1, EPD layer 460 of FIGS. 15-16 is analogous to layer 160 of FIG. 2 and 106 of FIG. 1, and bit line 456 of FIGS. 15-16 is analogous to bit line 156 of FIG. 2 and programming line 104 of FIG. 1. While both EPD layers 458 and 460 are shown in FIG. 15, this is not intended to be limiting and either one may be used alone or they both may be included in device structure 450, according to the needs of the designer. Similarly, EPD layers 458, 460 and regions 462 shown in FIG. 16 may all be used or any sub-combination of one or more layers or regions may be used. Either arrangement is useful. The discussion that follows describing various EPD layer structures for layers 458, 460 and/or regions 462, according to still additional embodiments of the invention, is intended to include such variations.

Figure 17:
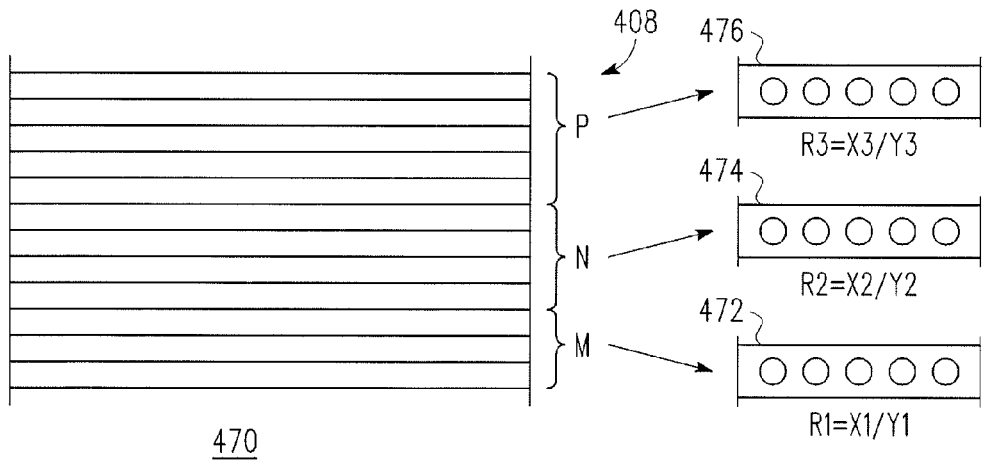
FIGS. 17-19 show schematic cross-sectional views through EPD structures that represent any or all of EPD layers or regions of FIGS. 15-16, according to yet additional embodiments of the invention.
Figure 18:
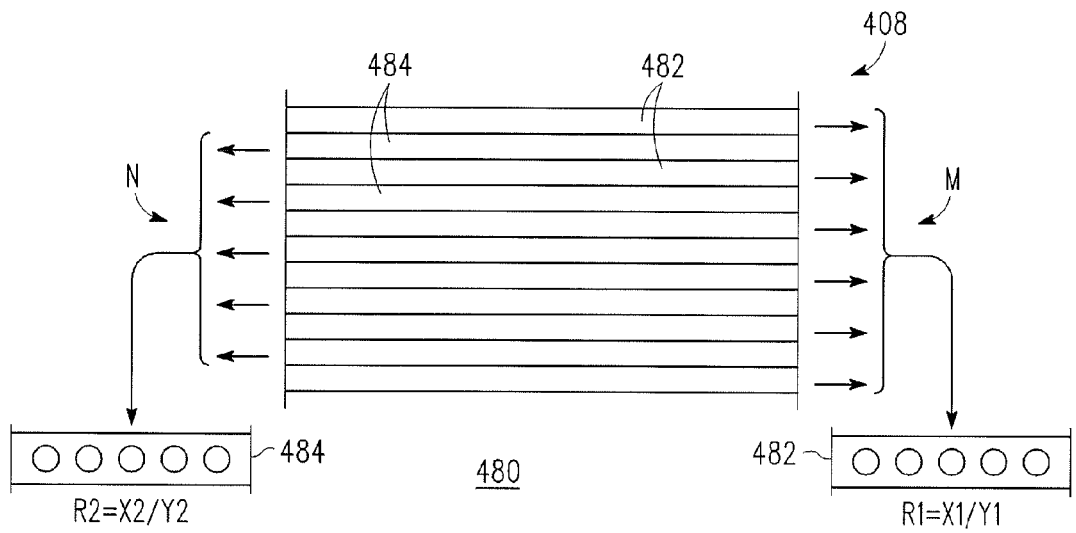
Figure 19:
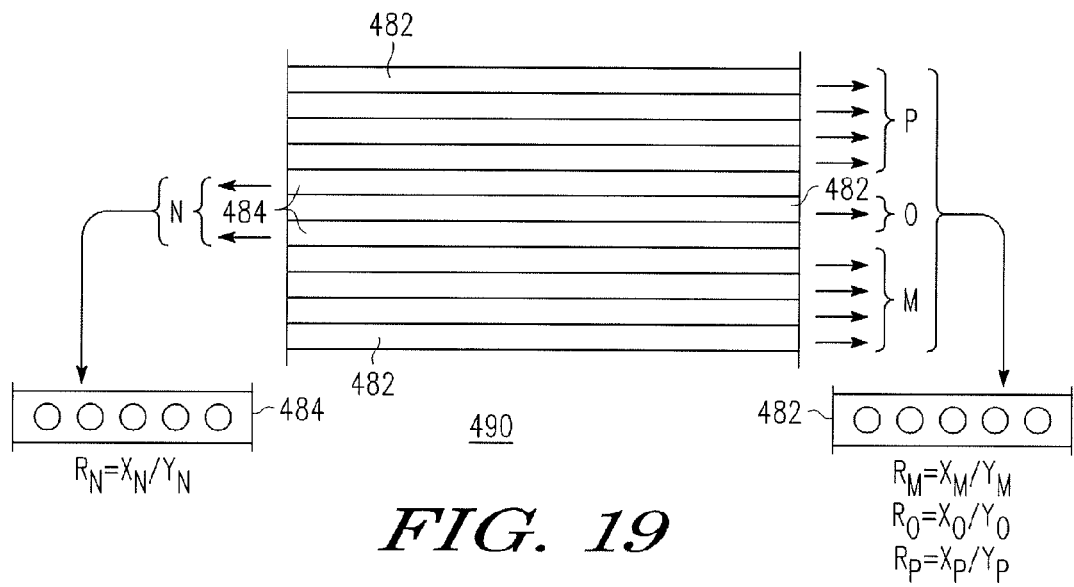

FIGS. 17-19 show schematic cross-sectional views through EPD structures 470, 480, 490 that represent any or all of EPD layers or regions 458, 460, 462, according to yet additional embodiments of the invention, wherein successive layers 408 have different R=X/Y values and different arrangements relative to each other. Referring now to FIG. 17 EPD structure 470 comprises multiple layers 408 arranged in groups M, N, and P with preferably different ratios R=X/Y, where M, N and P represent the number of layers 408-i within each group. In this embodiment: M layers have predetermined ratio R1=X1/Y1 as is illustrated, for example but not intended to be limiting, by layer 472; N layers have ratio R2=X2/Y2 as is illustrated by example and not intended to be limiting by layer 474; and P layers have ratios R3=X3/Y3 as is illustrated by example and not intended to be limiting by layer 476. M, N and P may be the same or different. Structure 470 of FIG. 17 is suitable for forming a substantially uniform permeability EPD layer, such as is illustrated in FIG. 13, wherein region 442 of FIG. 13 corresponds, for example, to the M layers with R1=13/15, region 443 of FIG. 13 corresponds, for example, to the N layers with R2=11/15 and region 444 of FIG. 13 corresponds, for example, to the P layers with R3=14/15. The ratios noted above are intended to be exemplary and not limiting. In a preferred embodiment, X is desirably in the range of about 1 to 5 nano-meters and Y is in the range of about 1-10 nano-meters. In a preferred embodiment, the ratios R1, R2 and R3 are adjusted so that the permeability μ is substantially the same in all three regions. Stated more generally, substantially uniform permeability EPD layers can be obtained by choosing R1~R3>R2. Other predetermined permeability profiles may be obtained by choosing other relative values of R1, R2 and R3. Also, persons of skill in the art will understand that the sequence of layers may be inverted depending upon the relative location of the EPD layers to the word or bit line or the bit. For example, and not intended to be limiting, while FIG. 17 illustrates the sequence M, N, P, the sequence P, N, M may also be used.

Referring now to FIG. 18, EPD structure 480 comprises multiple M+N layers 408-i arranged so that M layers alternate with N layers and the M and N layers have different properties, e.g., different ratios R=X/Y and different permeabilities μ where $\mu_M > \mu_N$, referring respectively to the M and N layers. For example, M layers 482 are provided having average thickness ratios R1=X1/Y1 interleaved with N layers 484 having average thickness ratios R2=X2/Y2. To obtain $\mu_M > \mu_N$, it is desirable that R1>R2. It is also desirable but not essential that layer type 482 having ratio R1 form the outer-most layers of structure 480.

Referring now to FIG. 19, EPD structure 490 comprises multiple M+N+O+P layers 408-i arranged so that there are M layers 408-i (i=1 to M) of average thickness ratio $R_M = X_M/Y_M$ (e.g., of type 482), followed by N layers 408-i (i=1 to N) of average thickness ratio $R_N = X_N/Y_N$ (e.g., of type 484) with O layers 408-i (i=1 to O) of average thickness ration $R_O = X_O/Y_O$ (e.g., of type 482) interleaved therebetween, and then P layers 408-i (i=1 to P) of average thickness ratio $R_P = X_P/Y_P$. M and P can be the same or different and $R_M$ and $R_P$ and $R_O$ can be the same or different provided that $\mu_{M,O,P} > \mu_N$. In general, although not essentially, it is desirable that (M+P)≧(N+O). Stated another way, it is desirable, that N≧1, M≧1, O≧1, P≧1, N>O, M≧N and P≧N.

Structures 480, 490 have several advantages: First, the layers having the highest permeability μ can be placed closest to the bit lines and/or digit lines and, optionally, the magnetic bit. Second, the intervening lower permeability μ layers (e.g., layers 484) have higher breakdown voltage and lower electrical leakage, thereby preserving these properties of the overall structure 480, 490. Third, by choosing suitable average thickness ratios RM, $R_N$, $R_P$, etc., greater uniformity (or other predetermined profile) of the magnetic permeability μ may also be achieved where desired. The combination of higher permeability without loss of dielectric breakdown strength or increase in dielectric leakage are unique advantages of the invented structures and method. The ability to grade the permeability as a function of total thickness TT to be either substantially uniform or to have another predetermined tailored thickness dependent permeability profile, is a further advantage of the invented arrangement and method. Increasing the magnetic permeability μ in proximity to the digit lines and/or the bit line and/or the magnetic bit itself, increases the magnitude of the magnetic field B in the vicinity of the magnetic bit, for the same drive current through the digit and bit lines. For a given geometry and magnetic memory bit, the drive current needed to create a local field B at the memory bit that exceeds the bit switching threshold, is less than that required in the absence of these EPD layers or regions. In this way, the drive current needed to alter and/or flip the state of the magnetic bit can be made smaller without sacrificing other electrical properties of the memory bit. These are significant improvements.

According to a first embodiment, there is provided a magnetoelectronic device structure comprising, a programming line, a magnetoelectronic device magnetically coupled to said programming line, an enhanced permeability dielectric (EPD) material disposed adjacent to said magnetoelectronic device, wherein said EPD material comprises magnetic material and dielectric material, and wherein the ratio of magnetic material to dielectric material is varied as a function of thickness of the EPD material to provide a predetermined permeability profile in said EPD material. According to a further embodiment, the EPD material comprises multiple superposed layers of magnetic material and dielectric material, and a ratio R=X/Y of an average thickness X of the superparamagnetic material to an average thickness Y of the dielectric material in the composite layers is varied in different layers to obtain said predetermined permeability profile. According to a still further embodiment, the EPD material comprises at least M layers having thickness ratios R1=X1/Y1 and N layers having thickness ratios R2=X2/Y2, wherein R1 and R2 are different. According to a yet further embodiment, the M and N layers are at least partially interleaved. According to a still yet further embodiment, the dielectric material comprises at least one material selected from the group consisting of alumina, silicon dioxide, silicon nitride, magnesium oxide, hafnium oxide, tantalum oxide, titanium oxide, vanadium oxide, niobium oxide and combinations thereof, and the magnetic material comprise at least one magnetic material selected from the group consisting of nickel, iron, cobalt, alloys of nickel, alloys of iron, alloys of cobalt, combinations thereof and alloys of Co, Fe and B. According to a yet still further embodiment, said magnetic material comprises superparamagnetic nano-particles with sizes in the range of about 2 nano-meters to about 10 nano-meters. According to an additional embodiment, the multiple superposed composite layers comprise superparamagnetic material having an average thickness X in the range of about 1 to 5 nano-meters and dielectric material having an average thickness Y in the range of about 1 to 10 nm. According to a still additional embodiment, said multiple superposed composite layers comprise at least M composite layers of a first thickness ratio R1=X1/Y1 and N composite layers of second thickness ratio R2=X2/Y2, wherein R2<R1. According to a yet additional embodiment, said multiple superposed composite layers comprise at least M composite layers of a first thickness ratio R1=X1/Y1, N composite layers of second thickness ratio R2=X2/Y2, and P composite layers of a third thickness ratio R3=X3/Y3, wherein R1~R3>R2. According to a still yet additional embodiment, the M or P composite layers are closer to the programming line than the N composite layers. According to a yet still additional embodiment, the N, M and P composite layers have total thicknesses $T_N$, $T_M$ and $T_P$ respectively, and $T_N < (T_M + T_P)$ and $T_M$ and $T_P$ are the same or different.

According to a second embodiment, there is provided a method for making a magnetoelectronic device structure, the method comprising, in either order, fabricating a magnetoelectronic device, depositing a first conducting line, and forming between the magnetoelectronic device and the first conducting line or laterally around the magnetoelectronic device or both, an enhanced permeability dielectric (EPD) material comprising multiple magnetic material and dielectric material and having a predetermined total thickness, wherein a ratio of magnetic material to dielectric material is varied as a function of the total thickness to provide a predetermined permeability profile. According to a further embodiment, the step of forming the EPD material comprises, forming composite layers of dielectric of average thickness Y in which are located nano-particles of a magnetic material of average thickness X, adapted to exhibit superparamagnetic properties, wherein a ratio R=X/Y is different in at least some of the multiple layers. According to another embodiment, the step of the EPD material is performed, after the step of depositing a first conducting line and before the step of fabricating a magnetoelectronic device, or before the step of depositing a first conducting line and after the step of fabricating a magnetoelectronic device. According to a still further embodiment, the step of forming the EPD material laterally around the magnetoelectronic device is performed, after the step of depositing a first conducting line and before the step of fabricating a magnetoelectronic device, or after the step of depositing a first conducting line and after the step of fabricating a magnetoelectronic device. According to a yet further embodiment, the step of forming an EPD material comprises, forming in any order, M composite layers having a first ratio R1=X1/Y1 and N composite layers exhibiting a second ratio R2=X2/Y2 different from R1, where M≧N. According to a yet further embodiment, the M and N composite layers are at least partially interleaved.

According to a third embodiment, there is provided a method for fabricating an enhanced permeability dielectric (EPD) material of a predetermined thickness, the method comprising, forming on a substrate a substantially discontinuous layer of nano-particles exhibiting superparamagnetic properties and of average thickness X, depositing a layer of dielectric material overlying said discontinuous layer of superparamagnetic nano-particles and of average thickness Y, thereby forming a composite dielectric layer in which said superparamagnetic nano-particles are embedded, and alternately repeating the forming and depositing steps, to create a stack of said composite layers having the predetermined thickness, wherein X and Y have different values in at least some of the layers. According to a further embodiment, the method further comprises forming M layers having a ratio R1=X1/Y1 and N layers having a ratio R2=X2/Y2, wherein R1≠R2, and R1 and R2 are in the range of about 0.3 to about 1.0.

Magnetoelectronic device structures that utilize low power for programming in accordance with the present invention have been described. The magnetoelectronic device structures utilize enhanced permeability dielectric materials that are disposed between a magnetoelectronic information storage device and a programming line and/or around the magnetoelectronic information storage device. The enhanced permeability dielectric materials exhibit magnetic permeabilities no less than 1.5. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetoelectronic device structure comprising:
   a programming line;
   a magnetoelectronic device magnetically coupled to said programming line;
   an enhanced permeability dielectric (EPD) material disposed adjacent to said magnetoelectronic device;
   wherein said EPD material comprises multiple superposed composite layers of magnetic material and dielectric material; and
   wherein a ratio R=X/Y of an average thickness X of the magnetic material to an average thickness Y of the dielectric material in the composite layers is varied in different layers to provide a predetermined permeability profile in said EPD material.

2. The magnetic device structure of claim 1, wherein the EPD material comprises at least M layers having thickness ratios R1=X1/Y1 and N layers having thickness ratios R2=X2/Y2, wherein R1 and R2 are different.

3. The magnetic device structure of claim 1, wherein the M layers and the N layers are at least partially interleaved.

4. The magnetoelectronic device structure of claim 1, wherein the dielectric material comprises at least one material selected from the group consisting of alumina, silicon dioxide, silicon nitride, magnesium oxide, hafnium oxide, tantalum oxide, titanium oxide, vanadium oxide, niobium oxide and combinations thereof, and the magnetic material comprise at least one magnetic material selected from the group consisting of nickel, iron, cobalt, alloys of nickel, alloys of iron, alloys of cobalt, combinations thereof and alloys of Co, Fe and B.

5. The magnetoelectronic device structure of claim 1, wherein said magnetic material comprises superparamagnetic nano-particles with sizes in the range of about 2 nano-meters to about 10 nano-meters.

6. The magnetoelectronic device structure of claim 1, wherein the multiple superposed composite layers comprises superparamagnetic material having an average thickness X in the range of about 1 to 5 nano-meters and dielectric material having an average thickness Y in the range of about 1 to 10 nm.

7. The magnetoelectronic device structure of claim 1, wherein said multiple superposed composite layers comprise at least M composite layers of a first thickness ratio R1=X1/Y1 and N composite layers of second thickness ratio R2=X2/Y2, wherein R2<R1.

8. The magnetoelectronic device structure of claim 1, wherein said multiple superposed composite layers comprise at least M composite layers of a first thickness ratio R1=X1/Y1, N composite layers of second thickness ratio R2=X2/Y2, and P composite layers of a third thickness ratio R3=X3/Y3, wherein R1~R3>R2.

9. The magnetoelectronic device structure of claim 8, wherein the M or P composite layers are closer to the programming line than the N composite layers.

10. The magnetoelectronic device structure of claim 9, wherein the N, M and P composite layers have total thicknesses $T_N$, $T_M$ and $T_P$ respectively, and $T_N<(T_M+T_P)$ and $T_M$ and $T_P$ are the same or different.

11. A method for making a magnetoelectronic device structure, the method comprising:
    in either order;
    fabricating a magnetoelectronic device;
    depositing a first conducting line; and
    forming between the magnetoelectronic device and the first conducting line or laterally around the magnetoelectronic device or both, an enhanced permeability dielectric (EPD) material comprising forming multiple composite layers of dielectric of average thickness Y in which are located nano-particles of a magnetic material of average thickness X, adapted to exhibit superparamagnetic properties, and wherein a ratio R=X/Y is different in at least some of the multiple layers EPD to provide a predetermined permeability profile.

12. The method for making a magnetoelectronic device structure of claim 11, wherein the step of forming the EPD material is performed:

after the step of depositing a first conducting line and before the step of fabricating a magnetoelectronic device; or before the step of depositing a first conducting line and after the step of fabricating a magnetoelectronic device.

13. The method for making a magnetoelectronic device structure of claim 11, wherein the step of forming the EPD material laterally around the magnetoelectronic device is performed:

after the step of depositing a first conducting line and before the step of fabricating a magnetoelectronic device; or after the step of depositing a first conducting line and after the step of fabricating a magnetoelectronic device.

14. The method for making a magnetoelectronic device structure of claim 11, wherein the step of forming an EPD material comprises:

forming in any order, M composite layers having a first ratio R1=X1/Y1 and N composite layers exhibiting a second ratio R2=X2/Y2 different from R1, where M≧N.

15. The method for making a magnetoelectronic device structure of claim 14, wherein the M and N composite layers are at least partially interleaved.

16. A method for fabricating an enhanced permeability dielectric (EPD) material of a predetermined thickness, the method comprising:

forming on a substrate a substantially discontinuous layer of nano-particles exhibiting superparamagnetic properties and of average thickness X;

depositing a layer of dielectric material overlying said discontinuous layer of superparamagnetic nano-particles and of average thickness Y, thereby forming a composite dielectric layer in which said superparamagnetic nano-particles are embedded; and alternately repeating the forming and depositing steps, to create a stack of said composite layers having the predetermined thickness, wherein X and Y have different values in at least some of the layers, and wherein M layers are formed having a ratio R1=X1/Y1 and N layers having a ratio R2=X2/Y2, wherein R1≠R2 and M>N.

17. The method for fabricating an enhanced permeability dielectric (EPD) material of a predetermined thickness of claim 16, wherein R1 and R2 are in the range of about 0.3 to about 1.0.

* * * * *